United States Patent [19]

Schade, Jr.

[11] Patent Number: 4,924,113

[45] Date of Patent: May 8, 1990

[54] TRANSISTOR BASE CURRENT COMPENSATION CIRCUITRY

[75] Inventor: Otto H. Schade, Jr., North Caldwell, N.J.

[73] Assignee: Harris Semiconductor Patents, Inc., Melbourne, Fla.

[21] Appl. No.: 220,712

[22] Filed: Jul. 18, 1988

[51] Int. Cl.[5] .......................... H03K 3/01; H03K 3/26

[52] U.S. Cl. ................................. 307/296.6; 307/270; 323/316

[58] Field of Search .................. 307/296.6, 296.1, 443, 307/270; 323/316

[56] References Cited

U.S. PATENT DOCUMENTS

| | | | |
|---|---|---|---|
| 4,064,448 | 12/1977 | Eatock | 307/296.6 |
| 4,263,519 | 4/1981 | Schade, Jr. | 307/296.6 |
| 4,361,797 | 11/1982 | Kojima et al. | 307/296.6 |
| 4,443,753 | 4/1984 | McGlinchey | 307/296.6 |
| 4,446,419 | 5/1984 | van de Plassche et al. | 307/296.6 |
| 4,506,208 | 3/1985 | Nagano | 307/296.6 |

*Primary Examiner*—Stanley D. Miller

*Assistant Examiner*—Richard Roseen

*Attorney, Agent, or Firm*—Henry I. Schanzer

[57] ABSTRACT

The accuracy of a bandgap type reference voltage generator which contains bipolar load elements is increased by the use of current compensation circuitry which includes a dummy load element which is the electrical equivalent of the load elements of the generator, an operational amplifier and a current mirror. The operational amplifier and the current mirror act to cause the same potential level (voltage) to be applied to the dummy load element as is applied to the load elements of the generator. A master leg of the current mirror generates a first output current which is identical to the current drawn by the load elements of the generator and provides the current to the dummy load element. A slave leg of the current mirror generates a second output current which is identical to the first output current and which is coupled to the load elements of the generator. Thus current used to drive the load elements of the generator is supplied by the compensation circuitry. This improves the accuracy of the output voltage generated by the reference voltage generator.

17 Claims, 1 Drawing Sheet

FIG. 1
(PRIOR ART)
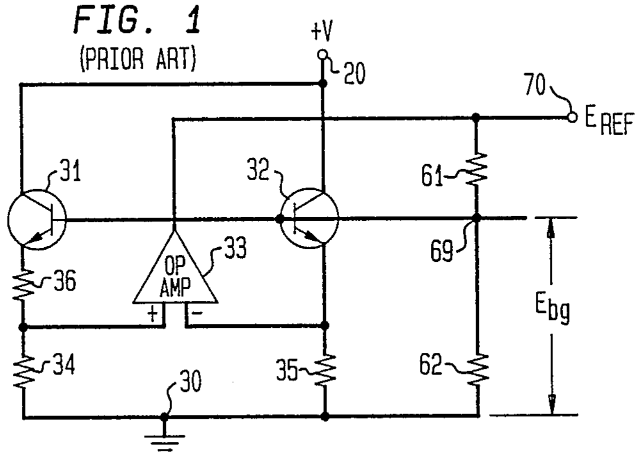
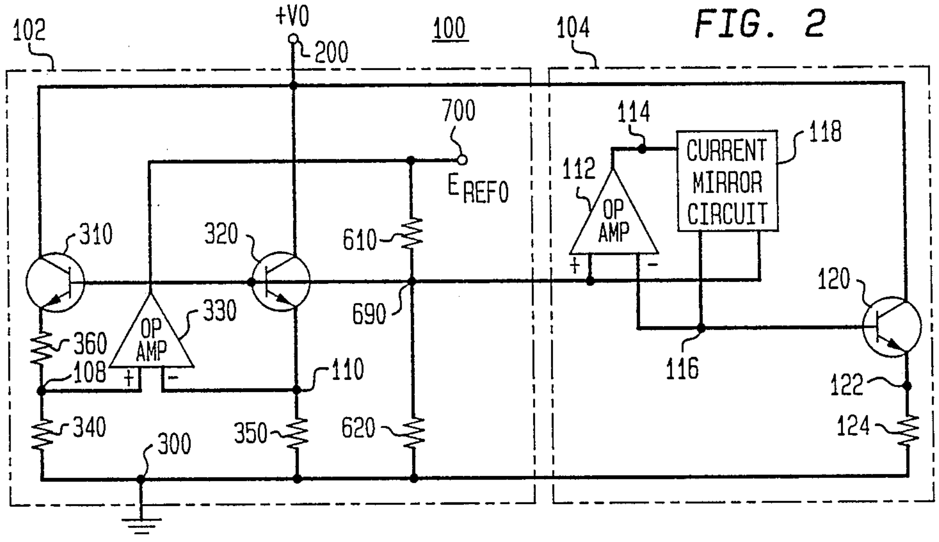
FIG. 2
FIG. 3
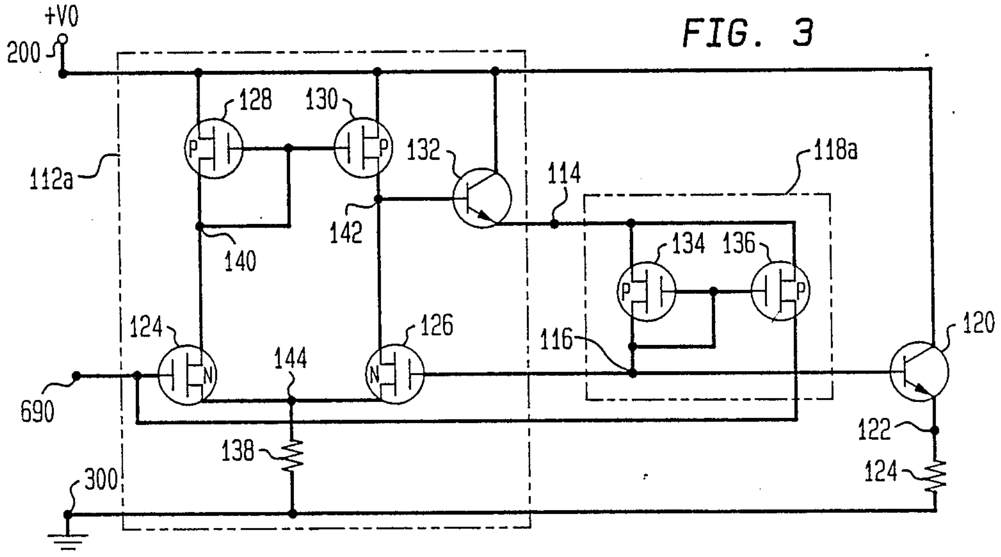

TRANSISTOR BASE CURRENT COMPENSATION CIRCUITRY

FIELD OF THE INVENTION

This invention relates to a system which compensates for load current drawn from a source to limit loading of the source and in particular to a system which effectively cancels the loading effects of bipolar transistors of a voltage reference circuit so as to increase the accuracy thereof.

BACKGROUND OF THE INVENTION

U.S. Pat. No. 4,263,519, in which there is common inventorship and a common assignee with the present patent application, is directed to a plurality of voltage reference circuits that each use the parasitic bipolar transistors formed by the drain regions, p-wells and the monolithic substrate of a Complementary Metal-Oxide Silicon (CMOS) integrated circuit. Reproduced herein and denoted as FIG. 1 is the circuitry of FIG. 5 of the U.S. Pat. No. 4,263,519. The $E_{REF}$ voltage appearing at output terminal 70 is a reference voltage that is relatively accurate. The bandgap voltage ($E_{BG}$) appears between terminals 69 and 30. If resistor 61 is equal to resistor 62, then $E_{REF}=2\ E_{BF}$. The operation of the circuit of FIG. 1 herein is well known and is described in U.S. Pat. No. 4,263,519 which is incorporated herein by reference. Some applications require greater accuracy than this circuit is capable of. One limiting factor on the accuracy of this circuit is that base current is drawn from node 69 to drive transistors 31 and 32. This base current, even through it is typically only a small fraction of the current flow through resistor 61, limits the accuracy of the voltage appearing at output terminal 70. In some applications, the needed accuracy of a reference voltage is greater than can be achieved by the circuitry of U.S. Pat. No. 4,263,519.

U.S. Pat. No. 3,551,832 (J. G. Graeme) is directed to complementary bipolar circuitry which generates a current equal to load base current it draws from a source. The generated current is fed back to the source such that effectively the circuitry draws essentially no current from the source. Accordingly, there is effectively no loading of the source and the output voltage thereof can stay within a highly accurate range. One requirement of the Graeme circuitry is that the collectors of the transistors be separate. A silicon chip in which there are fabricated complementary metal-oxide silicon (CMOS) transistors inherently contains parasitic bipolar transistors in which all of the collectors are common, typically being part of the substrate of the chip. Thus, the Graeme circuitry is not easily fabricated in such a chip since it requires bipolar transistors with separate collectors. A chip, which includes CMOS and bipolar transistors in which the collectors are separate, is more complex to fabricate and therefore generally more expensive than one which uses the inherent parasitic bipolar transistors.

It is thus desirable to have circuitry which can be formed using the parasitic bipolar transistors and conventional Field Effect Transistors (FETs) of a Complementary Metal-Oxide-Silicon (CMOS) integrated circuit to compensate for the needed base drive of a voltage reference circuit as described.

SUMMARY OF THE INVENTION

In a preferred embodiment the present invention is directed to current compensation circuitry which is connectible to a voltage generator (e.g., the previously discussed bandgap reference voltage generator) which comprises or drives a load element, such as bipolar transistors, whose base current requirements limit the accuracy of the voltage generator. The compensation circuitry is adapted to supply the needed base current and thus improves the accuracy of the voltage generator. It preferably is fabricated on a CMOS integrated circuit chip using parasitic bipolar transistors.

In one embodiment the compensation circuitry comprises an operational amplifier having two inputs and an output, a current mirror having an input and two outputs and a load element. The output of the operational amplifier is coupled to the input of the current mirror. The first output of the current mirror is coupled to the second input of the operational amplifier and to the load element. The second output of the current mirror is coupled to the first input of the operational amplifier. The output of the operational amplifier is coupled to the input of the current mirror.

In another embodiment the compensation circuitry comprises a first load element, first circuit means having first and second inputs and an output with the output being coupled to the second input thereof for generating at the second input thereof a potential level which is essentially the same as one applied to the first input thereof, and second circuit means coupled to the first and second inputs of the first circuit means for sensing current drawn by the first load element and for generating an essentially identical current flow into a node coupled to the first input of the first circuit means.

The invention will be better understood from the following detailed description taken in connection the accompanying drawings.

BRIEF DESCRIPTION OF THE DRAWINGS

FIG. 1 shows a schematic of a prior art reference voltage generator;

FIG. 2 shows a reference voltage generator with current compensation circuitry in accordance with the present invention; and FIG. 3 shows a preferred embodiment of the current compensation circuitry of FIG. 2.

DETAILED DESCRIPTION

Referring now to FIG. 2, there is shown a reference voltage generator circuit with current compensation 100 comprising within a first dashed line rectangle a reference voltage generator 102 and within a second dashed line rectangle current compensation circuitry 104 in accordance with the present invention. Reference voltage generator 102 is the same as the prior art reference voltage circuitry shown in FIG. 1 herein. The reference numbers used for the components and terminals of circuitry 102 are the same as those used for the corresponding components and terminals of the prior art circuitry sown in FIG. 1 with a "0" added there after. One limitation of the accuracy of reference voltage generator 102 is that base current needed to bias n-p-n transistors 310 and 320 is drawn from resistor 610 via node 690. The base current for transistors 310 and 320 varies with the betas of the transistors and with temperature. Transistor 310 and resistors 340 and 360 and transistor 320 and resistor 350 may be denoted as load elements. As will become clear from the following description, current compensation circuitry 104 generates a current which flows into node 690 and is essentially identical to the base current which flows from node 690 and into the bases of transistors 310 and 320. The base current normally drawn through node 690 from resistor 610 is replaced by current compensation circuitry 104 and thus essentially all of the current flow through resistor 610 flows through resistor 620. This improves the accuracy of the output voltage $E_{REFO}$ appearing at terminal 700 of reference generator circuitry 102 by typically an order of magnitude or better.

Current compensation circuitry 104 comprises a two input operational amplifier 112, a current mirror circuit 118, an n-p-n transistor 120 and a resistor 124. Operational amplifier 112 may be denoted as a first circuit means; current mirror circuit 118 may be denoted as a second circuit means; and transistor 120 and resistor 124 may be denoted as a load element or as a dummy load element. Node 690 is coupled to a positive input terminal of operational amplifier 112 and to a second (slave) output terminal of current mirror circuit 118. A negative input terminal of operational amplifier 112 is coupled to a first (master) output terminal of current mirror circuit 118, to the base of transistor 120 and to a node 116. An output terminal of operational amplifier 112 is coupled to an input (generally denoted in the art as a common terminal) of current mirror circuit 118 and to a node 114. The emitter of transistor 120 is coupled to a first terminal of resistor 124 and to a node 122. The collector of transistor 120 is coupled to a terminal 200 and to a positive voltage +VO. A second terminal of resistor 124 is coupled to a terminal 300 and a reference voltage which is shown as ground.

The electrical path from the output of operational amplifier 112, through current mirror circuit 118 and to the negative input of operational amplifier 112 and the base of transistor 120, effectively causes the potential of node 116 to be essentially the same as the potential of node 690. Transistor 120 is designed to be the equivalent of transistors 310 and 320 and resistor 124 is designed to be equal to the equivalent of resistors 340, 360 and 350. If the same power supplies and base voltages are applied to transistors 310, 320 and 120, then the same total base current that flows into both transistors 310 and 320 flows into the base of transistor 120. Current mirror 118 acts to generate a flow of current into the bases of transistors 310 and 320 (node 690) which is identical to that flowing into the base of transistor 120 (node 116). Thus the current flow from node 690 to provide base current for transistors 310 and 320 is supplied into node 690 by circuitry 104 instead of having to be supplied from resistor 610. Accordingly, circuitry 104 supplies all of the base current for transistors 310 and 320 and thus all the current which flows through resistor 610 also flows through resistor 620. This improves the accuracy of the voltage $E_{REFO}$ appearing at the output terminal 700 of reference voltage generator 102 by typically an order of magnitude or better.

Referring now to FIG. 3, there is illustrated a preferred embodiment of current compensation circuitry 104 with circuitry of operational amplifier 112 shown within a dashed line rectangle 112*a* and circuitry of the current mirror circuit 118 shown within a dashed line rectangle 118*a*.

Operational amplifier 112 comprises Field Effect Transistors (FETs) 124, 126, 128 and 130, an n-p-n bipolar transistor 132 and a resistor 138. Current mirror circuit 118 comprises FETs 134 and 136. In a preferred embodiment FETs 124 and 126 are both n-channel Metal-Oxide-Silicon (MOS) FETs and FETs 128, 130, 134 and 136 are all p-channel MOS FETs. The gate of transistor 124 is coupled to the source of FET 136 and to node 690. The sources of transistors 124 and 126 are coupled to a first terminal of resistor 138 and to a node 144. Second terminals of resistors 138 and 124 are coupled to terminal 300 and to ground potential. The sources of transistors 128 and 130 and the collectors of transistors 120 and 132 are coupled together to terminal 200 and to positive voltage +VO. The drain of transistor 124 is coupled to the gates of transistors 128 and 130, to the drain of transistor 128 and to a node 140. The drain of transistor 126 is coupled to the drain of transistor 130, to the base of transistor 132 and to a node 142. The emitter of transistor 132 is coupled to the sources of transistors 134 and 136 and to node 114. The gates of transistors 126, 134 and 136 are coupled to the drain of transistor 134, to the base of transistor 120 and to node 116. The emitter of transistor 120 is coupled to one terminal of resistor 124 and to a node 122.

Transistors 134 and 136 serve as the master and slave legs, respectively, of the current mirror 118. The current that flows through transistor 134 is duplicated and flows through transistor 136. Thus the current that flows into the base of transistor 120 is essentially the same as flows into node 690 from transistor 136. The gates of transistors 124 and 126 draw essentially no current out of nodes 690 and 116, respectively, since the input impedances of transistors 124 and 126 is high as they are both FETs. Since transistor 120 and resistor 124 are the equivalent of transistors 310 and 320 and resistors 340, 360 and 350, and the supply voltages, +VO and ground, used for power are identical, the current flowing into the base of transistor 120 is essentially equal to the sum of the currents flowing into the bases of transistors 310 and 320. In view of this it is clear that the current needed to bias transistors 310 and 320 is supplied by compensation circuitry 104. Thus the current which flows through resistor 610 is the same as flows through resistor 620 and accordingly the accuracy of voltage generator circuitry 102 is improved.

It is to be understood that the embodiments described herein are merely illustrative of the principles of the invention. Various modifications are possible within the scope of the invention. For example, the circuit configurations used for operational amplifier 112 and current mirror circuit 118 may be modified or completely changed so long as the basic functions performed by these elements are maintained. Still further, the combination of transistor 120 and resistor 124 would be modified if the load elements of the voltage generator circuit are modified.

What is claimed is:

1. Circuitry comprising:

an operational amplifier having first and second inputs and an output;

a current mirror having an input coupled to the output of the operational amplifier, having a first output coupled to the second input of the operational amplifier and to a first load element and having a second output coupled to the first input of the operational amplifier; and a circuitry input/output terminal being coupled to the first input of the operational amplifier.

2. The circuitry of claim 1 wherein the first input of the operational amplifier is connectible to a second load element which is essentially an electrical equivalent of the first load element and which is a part of or is driven by a separate circuit.

3. The circuitry of claim 2 wherein each one of said first and second load elements comprises a separate bipolar transistor and a resistor.

4. The circuitry of claim 3 wherein the operational amplifier comprises field effect transistors.

5. The circuitry of claim 4 wherein the operational amplifier further comprises a bipolar transistor.

6. The circuitry of claim 5 wherein the field effect transistors are metal-oxide silicon transistors and the load elements each comprise at least one n-p-n bipolar transistor.

7. The circuitry of claim 5 wherein all the transistors are formed in a single integrated circuit chip with the n-p-n transistors all having common collectors.

8. The circuitry of claim 7, wherein the separate circuit is formed on the same integrated circuit chip as the circuitry and comprises n-p-n transistors having collectors which are common with the collectors of the n-p-n transistors of the circuitry.

9. Circuitry, which is connectible to and adapted to supply current to a first load element which is part of or driven by a separate circuit, comprising:

an operational amplifier having first and second inputs and an output;

a current mirror having an input coupled to the output of the operational amplifier, having a first output coupled to the second input of the operational amplifier and to a second load element and having a second output coupled to the first input of the operational amplifier and to the first load element; and the first and second load elements being electrically equivalent.

10. In combination:

a reference voltage generator comprising first and second n-p-n transistors and first, second, third, fourth and fifth resistors and a first operational amplifier having first and second inputs and an output;

each of the first and second n-p-n transistors having a base and an emitter;

the bases of the first and second transistors being coupled to first terminals of the first and second resistors;

the emitter of the first transistor being coupled to a first terminal of the third resistor and to the first input of the operational amplifier;

the emitter of the second transistor being coupled to a first terminal of the fourth resistor;

a second terminal of the fourth resistor being coupled to a first terminal of the fifth resistor and to the second input of the operational amplifier;

the output of the operational amplifier being coupled to a second terminal of the first resistor;

current compensation circuitry coupled to the bases of the first and second transistors comprising a second operational amplifier having first and second inputs and an output, a current mirror having an input and first and second outputs, a third n-p-n transistor and a sixth resistor;

the third n-p-n transistor having a base and an emitter;

the output of the second operational amplifier being coupled to the input of the current mirror;

the first output of the current mirror being coupled to the second input of the second operational amplifier and to the base of the third n-p-n transistor;

the second output of the current mirror being coupled to the bases of the first and second transistors and to the first input of the operational amplifier;

the emitter of the third transistor being coupled to a first terminal of the sixth resistor; and the combination of the third n-p-n transistor and the sixth resistor being designed to be essentially the electrical equivalent of the combination of the first transistor and third resistor and the second transistor and the fourth and fifth resistors.

11. The combination of claim 10 wherein the first, second and third n-p-n transistors all have collectors which are coupled together, and second terminals of the third, fifth and sixth resistors are coupled together.

12. The combination of claim 11 wherein the second resistor has a second terminal which is coupled to the second terminal of the third resistor.

13. The combination of claim 12 wherein the second operational amplifier comprises:

first, second, third and fourth field effect transistors (FETs), a fourth n-p-n transistor and a seventh resistor;

each of the FETs having a gate, a drain and a source;

the fourth n-p-n transistor having a base, an emitter and a collector;

the sources of the first and second FETs being coupled to the collector of the fourth n-p-n transistor;

the sources of the third and fourth FETs being coupled to a first terminal of the seventh resistor;

a second terminal of the seventh resistor being coupled to a second terminal of the sixth resistor;

the gates of the first and second FETs being coupled to the drains of the first and third FETs;

the drains of the second and fourth FETs being coupled to the base of the fourth n-p-n transistor;

the emitter of the fourth n-p-n transistor being coupled to the input of the current mirror; and the gate of the fourth FET being coupled to the first output of the current mirror and to the base of the third n-p-n transistor the gate of the third FET being coupled to the second output of the current mirror.

14. The combination of claim 13 wherein the current mirror comprises:

fifth and sixth field effect transistors (FETs) each having a gate, a source and a drain;

the sources of the fifth and sixth FETs serving as the input of the current mirror and being coupled to the emitter of the n-p-n fourth transistor;

the gates of the fifth and sixth FETs and the drain of the fifth FET serving as the first output of the current mirror and being coupled to the gate of the fourth FET and to the base of the third n-p-n transistor; and the drain of the sixth FET serving as the second output of the current mirror and being coupled to the gate of the third FET.

15. The combination of claim 14 wherein the first, second, third, fourth, fifth and sixth FETs are n-channel metal-oxide-silicon transistors.

16. Circuitry comprising:

a first load element;

first circuit means having first and second inputs and an output with the output being coupled to the second input thereof for generating at the second input thereof a potential level which is essentially the same as one applied to the first input thereof;

a circuitry input/output terminal being coupled to the first input of the first circuit means;

second circuit means coupled to the first and second inputs of the first circuit means for sensing current drawn by the first load element and for generating an essentially identical current flow into a node coupled to the first input of the first circuit means; and the output of the first circuit means being coupled to the second input thereof through the second circuit means.

17. Circuitry, which is connectible to and adapted to supply drive current to a first load element which is part of or is driven by a separate circuit, comprising:

a second load element which is the electrical equivalent of the first load element;

first circuit means having first and second inputs and an output with the output being coupled to the second input thereof for generating at the second input thereof a potential level (voltage) which is essentially the same as one applied to the first input thereof;

a circuitry input/output terminal being coupled to the first input of the first circuit means;

second circuit means coupled to the first and second inputs of the first circuit means of sensing current drawn by the second load element and for generating an essentially identical current flow into a node coupled to the first input of the first circuit means and to the first load element; and the output of the first circuit means being coupled to the second input thereof through the second circuit means.

* * * * *